(12) United States Patent
Sogabe

(10) Patent No.: US 8,477,544 B2
(45) Date of Patent: Jul. 2, 2013

(54) CIRCUIT APPARATUS AND SYSTEM

(75) Inventor: Haruhiko Sogabe, Kariya (JP)

(73) Assignee: Seiko Epson Corporation, Tokyo (JP)

( * ) Notice: Subject to any disclaimer, the term of this patent is extended or adjusted under 35 U.S.C. 154(b) by 43 days.

(21) Appl. No.: 13/170,141

(22) Filed: Jun. 27, 2011

(65) Prior Publication Data

US 2011/0316605 A1 Dec. 29, 2011

(30) Foreign Application Priority Data

Jun. 29, 2010 (JP) ................................. 2010-147673

(51) Int. Cl.
| | | |
|---|---|---|
| G11C 7/10 | (2006.01) | |
| H03K 19/0175 | (2006.01) | |
| G06F 13/00 | (2006.01) | |
| G06F 13/28 | (2006.01) | |
| B41J 29/38 | (2006.01) | |

(52) U.S. Cl.
USPC .......... 365/189.17; 326/82; 711/162; 347/13; 347/40

(58) Field of Classification Search
USPC ........ 326/82, 68, 83, 86, 87, 49, 56; 327/333, 327/108, 170; 710/100, 302
See application file for complete search history.

(56) References Cited

U.S. PATENT DOCUMENTS

| | | | |
|---|---|---|---|
| 5,338,982 A | | 8/1994 | Kawana |
| 5,696,994 A * | | 12/1997 | Pang ................................. 710/64 |
| 6,088,756 A * | | 7/2000 | Munoz-Bustamante ..... 710/100 |
| 6,246,259 B1 * | | 6/2001 | Zaliznyak et al. ............... 326/41 |
| 6,281,708 B1 * | | 8/2001 | Kenny .............................. 326/86 |
| 7,533,208 B2 * | | 5/2009 | Strangfeld et al. ............. 710/302 |
| 7,948,269 B1 * | | 5/2011 | Ballantyne et al. .............. 326/56 |
| 2002/0145445 A1 * | | 10/2002 | Iizuka .............................. 326/56 |
| 2003/0071663 A1 * | | 4/2003 | Taguchi et al. ................. 327/112 |
| 2003/0080787 A1 * | | 5/2003 | Yamauchi et al. .............. 327/108 |
| 2006/0277346 A1 * | | 12/2006 | Doak et al. ..................... 710/305 |
| 2010/0254202 A1 * | | 10/2010 | Asauchi ................... 365/189.17 |
| 2010/0257327 A1 * | | 10/2010 | Kosugi ........................... 711/162 |
| 2011/0199120 A1 * | | 8/2011 | Takahashi ........................ 326/86 |

FOREIGN PATENT DOCUMENTS

JP 05-090950 A 4/1993

* cited by examiner

*Primary Examiner* — Shawki Ismail
*Assistant Examiner* — Dylan White
(74) *Attorney, Agent, or Firm* — Kilpatrick Townsend & Stockton LLP

(57) ABSTRACT

A circuit apparatus includes an output circuit that outputs a signal to a host apparatus via a bus, and an output control circuit that controls the output circuit. The output circuit has a first conductive transistor provided between an output node and a first power source node, and a second conductive transistor provided between the output node and a second power source node. In a first output mode, the output control circuit controls one of the first conductive transistor and the second conductive transistor to go to off and controls the other transistor to go to on/off, whereas in a second output mode, the output control circuit controls the first conductive transistor to go to on and the second conductive transistor to go to off or vice versa.

15 Claims, 9 Drawing Sheets

FIG. 2A

FIRST OUTPUT MODE

| NR | NA | TN | TP | NQ |
|---|---|---|---|---|
| L | L | OFF | ON | H |
| L | H | OFF | OFF | HZ |

FIG. 2B

SECOND OUTPUT MODE

| NR | NA | TN | TP | NQ |
|---|---|---|---|---|
| H | L | OFF | ON | H |
| H | H | ON | OFF | L |

CIRCUIT APPARATUS AND SYSTEM

BACKGROUND

1. Technical Field

The present invention relates to circuit apparatuses and systems.

2. Related Art

In a system such as a memory system, in which multiple circuit apparatuses are connected in common to a single bus, an open-drain output circuit is employed as an output circuit in order to prevent interference between circuit apparatuses during data communication. With this output circuit, an L level is outputted by setting an output node to a high-impedance state. Accordingly, there is a problem in that it takes a long time for the output signal to change from H level to L level.

In response to this problem, JP-A-5-90950, for example, discloses a technique in which a three-state gate is employed. However, this approach is problematic in that the number of gates increases.

SUMMARY

An advantage of some aspects of the invention is to provide a circuit apparatus and system that can communicate efficiently by switching output modes.

A circuit apparatus according to a first aspect of the invention includes an output circuit that outputs a signal to a host apparatus via a bus and an output control circuit that controls the output circuit. The output circuit has a first conductive transistor provided between an output node and a first power source node, and a second conductive transistor provided between the output node and a second power source node. The output control circuit sets one of the first conductive transistor and the second conductive transistor to off and controls the other transistor on or off in a first output mode; and sets the first conductive transistor to on and the second conductive transistor to off, or sets the first conductive transistor to off and the second conductive transistor to on, in a second output mode. When the output circuit outputs an output signal to the output node, the output control circuit switches from the first output mode, in which the output node is set to a high-impedance state, to the second output mode; the output circuit outputs a voltage level corresponding to the output signal to the output node after the second output mode has been set; and the output control circuit switches the output circuit from the second output mode to the first output mode after the voltage level has been outputted to the output node.

According to this aspect of the invention, the output circuit outputs the output signal after the second output mode has been set and switches to the first output mode after the output signal has been outputted; therefore, it is possible to prevent interference with another circuit apparatus and furthermore shorten the communication time with the host apparatus.

According to another aspect of the invention, in the case where the output signal is changed from a first voltage level to a second voltage level, it is preferable that the output control circuit switch the output circuit from the first output mode to the second output mode and the output circuit change the output node from the first voltage level to the second voltage level after being set to the second output mode; and in the case where the output signal is changed from the second voltage level to the first voltage level, the output control circuit switch the output circuit from the first output mode to the second output mode, the output circuit change the output node from the second voltage level to the first voltage level after being set to the second output mode, and the output control circuit switch the output circuit from the second output mode to the first output mode after the output node has been set to the first voltage level.

Doing so makes it possible for the output circuit to change the output node from the second voltage level to the first voltage level after being set to the second output mode, which in turn makes it possible to reduce the amount of time required for the output signal to change from the second voltage level to the first voltage level. As a result, the amount of time required for, for example, the host apparatus to switch its communication partner to another circuit apparatus can be reduced, which makes it possible to shorten the communication time between the host apparatus and the circuit apparatus. In addition, because the first output mode can be returned to after the output signal has been set to the first level, it is possible to prevent interference with another circuit apparatus.

According to another aspect of the invention, in a first bus connection mode, it is preferable that the host apparatus and another circuit apparatus be connected to the bus; in a second bus connection mode, the host apparatus be connected to the bus, and the other circuit apparatus not be connected to the bus; in the second bus connection mode, the output control circuit set the output circuit to the second output mode; and in the first bus connection mode, the output control circuit switch the output circuit from the first output mode to the second output mode, and return the output circuit from the second output mode to the first output mode after the output signal has been outputted.

By doing so, the first bus connection mode is set in the case where multiple circuit apparatuses are connected to the bus, which makes it possible to shorten the communication time while also preventing interference between circuit apparatuses. Meanwhile, in the case where only a single circuit apparatus is connected to the bus, setting the second bus connection mode makes it possible to shorten the communication time. As a result, communication can be carried out efficiently in accordance with the number of circuit apparatuses connected to the bus.

According to another aspect of the invention, it is preferable that the circuit apparatus include a bus connection mode setting unit that sets the first bus connection mode and the second bus connection mode.

Doing so makes it possible for the bus connection mode to be set by the bus connection mode setting unit in accordance with the number of circuit apparatuses connected to the bus.

According to another aspect of the invention, it is preferable that the output signal outputted by the output circuit be a signal that notifies the host apparatus that a command issued by the host apparatus is currently being processed.

Doing so makes it possible for the host apparatus to determine whether the circuit apparatus is currently processing a command or if the processing of the command is complete. As a result, the communication between the host apparatus and the circuit apparatus can be carried out with certainty.

According to another aspect of the invention, it is preferable that the circuit apparatus include a data transfer circuit that transfers data between multiple storage apparatuses connected to a memory connection bus and the host apparatus.

Doing so makes it possible for communication to be carried out between the host apparatus and the multiple circuit apparatuses via the data transfer circuit in an efficient manner.

According to another aspect of the invention, it is preferable that the storage apparatus be a storage apparatus provided in a liquid receptacle.

Doing so makes it possible to store information for identifying the liquid receptacle and so on in the storage apparatus, which in turn makes it possible for the host apparatus to exchange necessary information related to the liquid receptacle with the storage apparatus via the circuit apparatus.

According to another aspect of the invention, in the case of an n (where n is an integer of 2 or more) color mode, it is preferable that the first bus connection mode be set; and in the case of a k (where k is an integer in which $1 \leq k < n$) color mode, the second bus connection mode be set.

By doing so, in the case where, in a printer or the like, more colors of ink are to be used, the first bus connection mode is set, which makes it possible to connect multiple circuit apparatuses to the bus and carry out communication in an efficient manner. On the other hand, in the case where there are fewer colors of ink, the second bus connection mode is set, which makes it possible to connect a single circuit apparatus to the bus and carry out communication in an efficient manner.

A system according to another aspect of the invention includes the circuit apparatus and the host apparatus described above.

BRIEF DESCRIPTION OF THE DRAWINGS

The invention will be described with reference to the accompanying drawings, wherein like numbers reference like elements.

FIGS. 2A and 2B are diagrams illustrating first and second output modes.

DESCRIPTION OF EXEMPLARY EMBODIMENTS

Hereinafter, an exemplary embodiment of the invention will be described in detail. Note that the embodiment described hereinafter is not intended to limit the content of the invention as described in the appended aspects of the invention in any way, and not all of the configurations described in this embodiment are required as the unit and method to solve the problems as described above.

1. Circuit Apparatus

Figure 1:
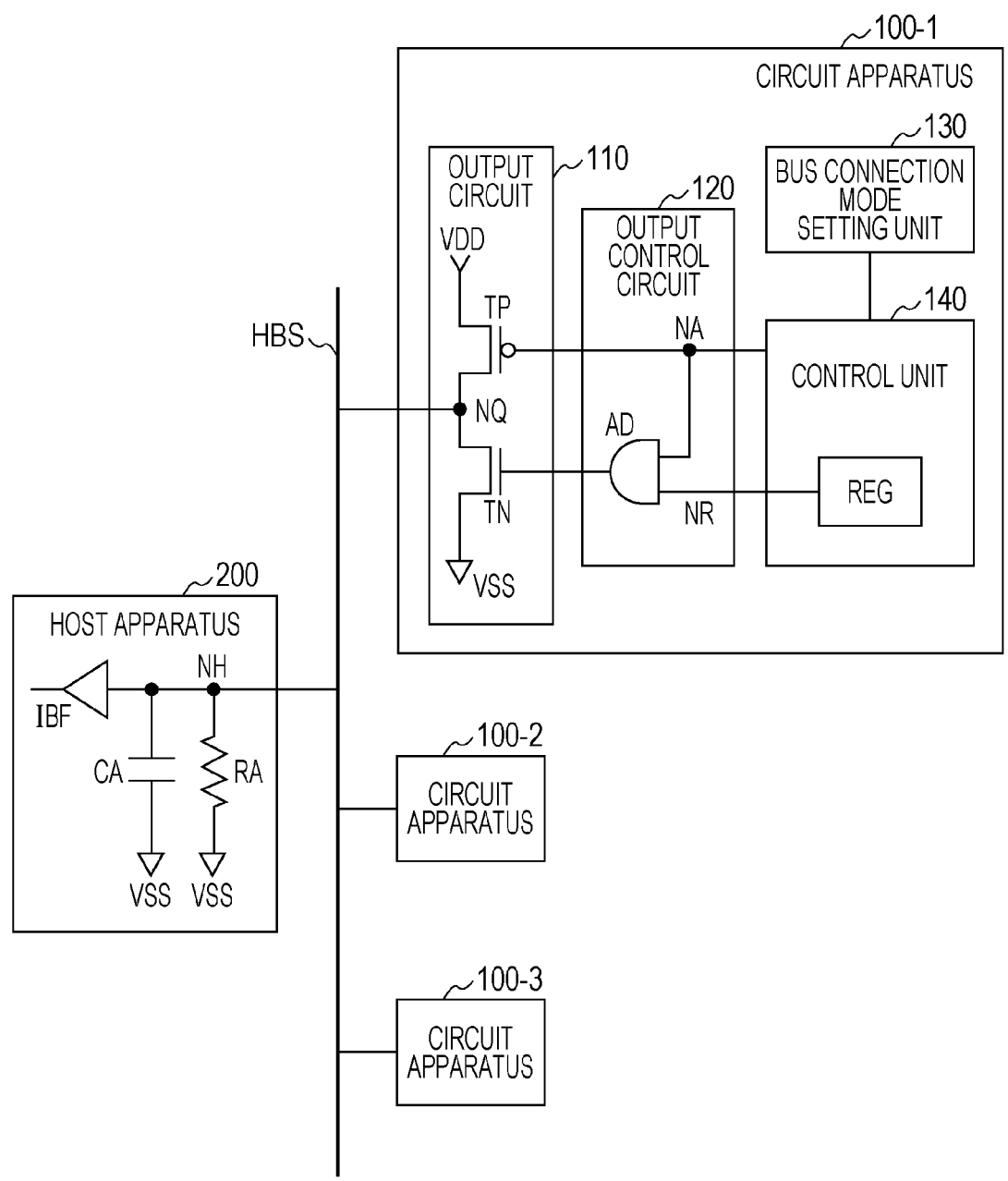
FIG. 1 illustrates an example of the basic configuration of a circuit apparatus.

FIG. 1 illustrates an example of the basic configuration of a circuit apparatus 100 (100-1 through 100-3) according to this embodiment. The circuit apparatus 100-1 according to this embodiment includes an output circuit 110, an output control circuit 120, a bus connection mode setting unit 130, and a control unit 140. Although not illustrated in FIG. 1, the circuit apparatuses 100-2 and 100-3 can be assumed to have the same configuration as the circuit apparatus 100-1. It should be noted that the circuit apparatus 100-1 according to this embodiment is not limited to the configuration illustrated in FIG. 1; many variations thereupon are possible, such as omitting some of the constituent elements, replacing those constituent elements with other constituent elements, adding other constituent elements, and so on.

The output circuit 110 outputs signals to a host apparatus 200 via a bus HBS. The output circuit 110 includes a first conductive transistor (an N-type transistor) TN provided between an output node NQ and a first power source node (a low-potential power source node) VSS, and a second conductive transistor (a P-type transistor) TP provided between the output node NQ and a second power source node (a high-potential power source node) VDD.

The output control circuit 120 sets the output circuit 110 to a first or a second output mode based on a signal from the control unit 140. To be more specific, in the first output mode, the output control circuit 120 controls one of the first conductive transistor TN and the second conductive transistor TP to go to off and the other to go to on/off. On the other hand, in the second output mode, the output control circuit 120 controls the first conductive transistor TN to go to on and the second conductive transistor TP to go to off, or vice versa.

The output control circuit 120 can be configured of, for example, an AND gate AD, as shown in FIG. 1. An output signal from the control unit 140 is inputted into one input node NA of the AND gate AD, whereas an output signal from a register REG of the control unit 140 is inputted into the other input node NR of the AND gate AD. The voltage level of the input node NA is applied to the gate of the P-type transistor TP of the output circuit 110, whereas the output voltage level of the AND gate AD is applied to the gate of the N-type transistor TN.

The bus connection mode setting unit 130 sets the control unit 140 to a first or a second bus connection mode. Specifically, in the first bus connection mode, the host apparatus 200 and another circuit apparatus (for example, the circuit apparatus 100-2, 100-3, or the like) are connected to the bus HBS. On the other hand, in the second bus connection mode, the host apparatus 200 is connected to the bus HBS, whereas the other circuit apparatuses are not connected. Control operations performed by the output control circuit 120 in the first and second bus connection modes will be described later.

The control unit 140 carries out output processes, output mode setting processes, and so on for the output circuit 110 and the output control circuit 120. The control unit 140 includes, for example, the register REG, as shown in FIG. 1, and the first and second output modes may be set based on the register value of this register REG. Furthermore, the control unit 140 may carry out a process for controlling communication between the circuit apparatus 100-1 and the host apparatus 200 via the bus HBS.

Although not shown in FIG. 1, it should be noted that the circuit apparatuses 100-1 to 100-3 may further include input circuits for obtaining signals from the host apparatus 200 via the bus HBS. Furthermore, the number of circuit apparatuses connected to the bus HBS is not limited to three, and may, for example, be one or two, or four or more.

The host apparatus 200 includes an input circuit IBF, a capacitor CA, and a resistance element RA. The input circuit IBF is inputted with signals from the circuit apparatuses 100-1 through 100-3 via the bus HBS. An input node NH of the input circuit IBF is electrically connected to the output nodes NQ of the output circuits 110 in the circuit apparatuses 100-1 through 100-3, respectively, via the bus HBS. The resistance element RA is provided in order to pull down the voltage level of the input node NH, or in other words, to reduce that voltage level to the low potential power source voltage VSS. The capacitor CA is provided in order to eliminate noise and the like present on the bus HBS. Although not shown in FIG. 1, it should be noted that the host apparatus 200 may further include an output circuit for outputting signals to the circuit apparatuses 100-1 through 100-3 via the bus HBS.

FIGS. 2A and 2B are diagrams illustrating the first and second output modes of the output circuit 110. FIG. 2A illustrates the voltage levels of the input nodes NR and NA and the output node NQ, as well as whether the transistors TN and TP are on or off, in the first output mode. In the first output mode, the node NR is set to L level (low potential level, or VSS level), and therefore the N-type transistor TN is always turned off regardless of the level of the node NA. On the other hand, the P-type transistor TP is turned on or off in accordance with the voltage level of the node NA. As a result, during the period in which the P-type transistor TP is on, the output node NQ is set to H level (high potential level, or VDD level), whereas during the period in which the P-type transistor TP is off, the output node NQ is set to a high-impedance state HZ.

As shown in FIG. 1, in the case where the multiple circuit apparatuses 100-1 through 100-3 are connected to the bus HBS, it is possible to prevent interference with signals outputted by other circuit apparatuses by setting the output node NQ to the high-impedance state HZ during the period in which the output circuit 110 does not output an output signal.

FIG. 2B illustrates the voltage levels of the input nodes NR and NA and the output node NQ, as well as whether the transistors TN and TP are on or off, in the second output mode. In the second output mode, the node NR is set to H level. Accordingly, the transistor TN is set to on and the transistor TP is set to off or vice versa in accordance with the voltage level of the node NA. In this manner, in the second output mode, the output node NQ is set to H level or L level.

With the circuit apparatus according to this embodiment, an output signal can be outputted by switching between the first and second output modes as described above. Doing so makes it possible to reduce the amount of time of communication between the host apparatus and the circuit apparatus. Hereinafter, switching between output modes as performed by the circuit apparatus according to this embodiment will be described in detail.

Figure 3A:
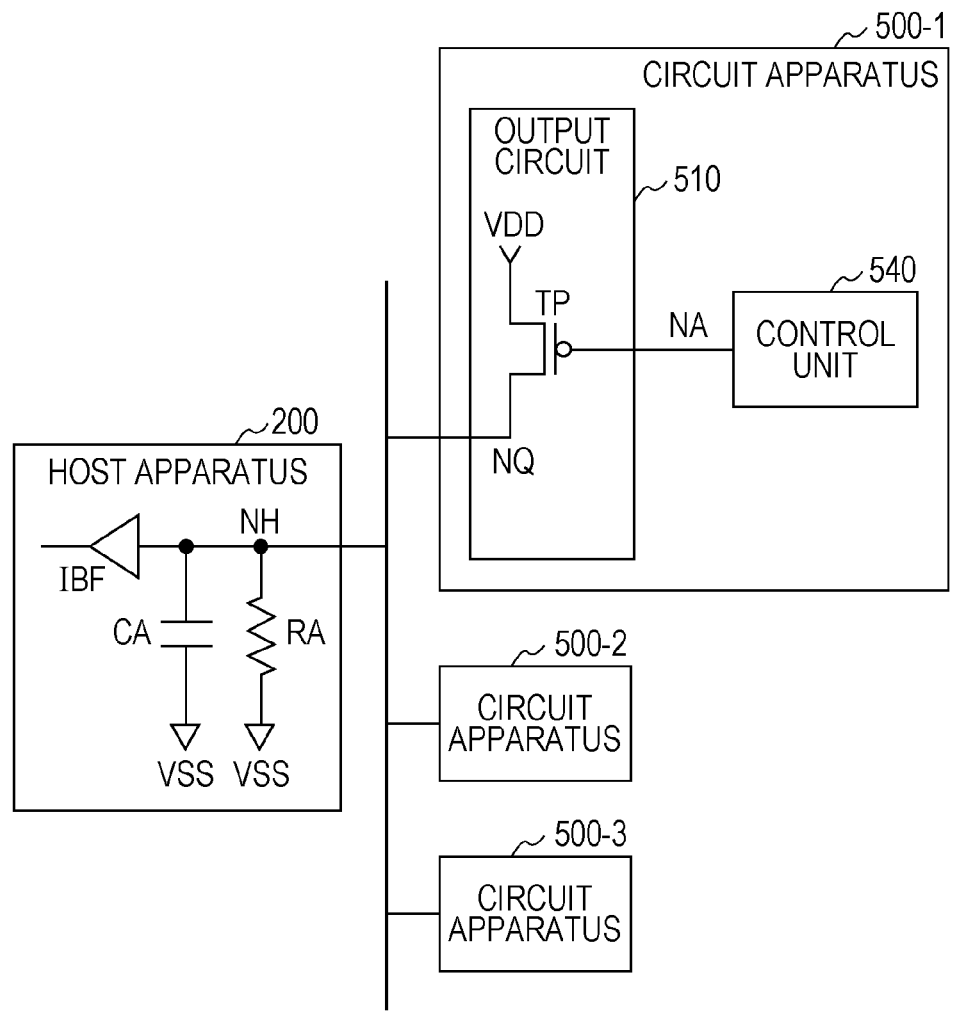
FIGS. 3A and 3B illustrate a comparative example of a circuit apparatus and an output signal waveform thereof.
Figure 3B:
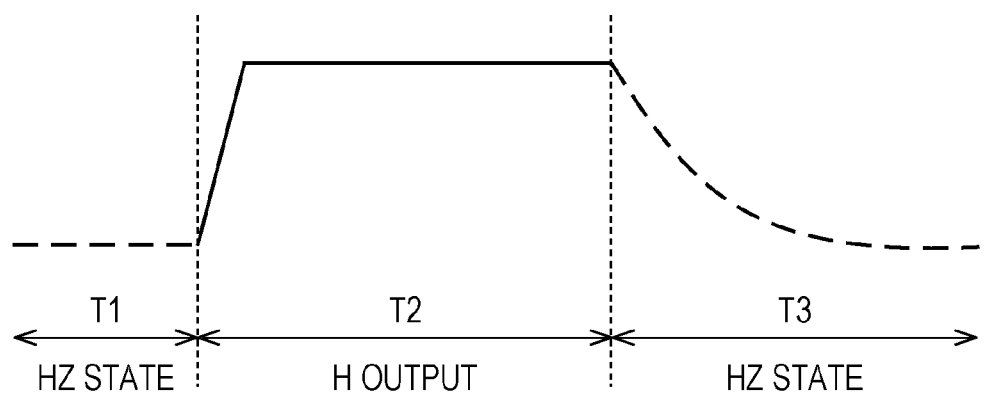

First, a comparative example of a circuit apparatus will be described. FIGS. 3A and 3B illustrate a comparative example of a circuit apparatus and an output signal waveform thereof. The circuit apparatuses 500 (500-1 through 500-3) serving as the comparative example illustrated in FIG. 3A each includes an output circuit 510 and a control unit 540. The output circuit 510 includes the P-type transistor TP, and the TP is provided between the output node NQ and the second power source node VDD. A signal from the control unit 540 is inputted into the gate input node NA of the TP.

In the case where the node NA is L level, the transistor TP is in the on state, and thus the output node NQ is set to H level. Meanwhile, in the case where the node NA is H level, the transistor TP is in the off state, and thus the output node NQ is set to the high-impedance state HZ.

FIG. 3B illustrates an example of an output signal waveform of the output circuit 510 according to the comparative example. In a first period T1, if the output of the output circuit 510 is in the high-impedance state HZ and the outputs of the other circuit apparatuses are also in the high-impedance state HZ, the level of the signal obtained by the host apparatus 200 (that is, the voltage level at the node NH) is L level. In the following second period T2, when the output circuit 510 outputs H level, the node NH is also set to H level. Then, in the third period T3, when the output of the output circuit 510 returns to the high-impedance state HZ, the charge accumulated in the capacitor CA is discharged due to the current that flows in the resistance element RA, and thus the node NH also returns to L level.

In this case, the amount of time of the drop from H level to L level (that is, the amount of time of the fall) depends on the product of the value of the capacitor CA (the capacitance value) and the resistance value of the resistance element RA (a CR damping time constant). For this reason, with the circuit apparatus 500 according to the comparative example, it takes a longer amount of time for the output signal to change from H level to L level, and thus it is difficult to shorten the communication time between the host apparatus and the circuit apparatus.

Figure 4A:
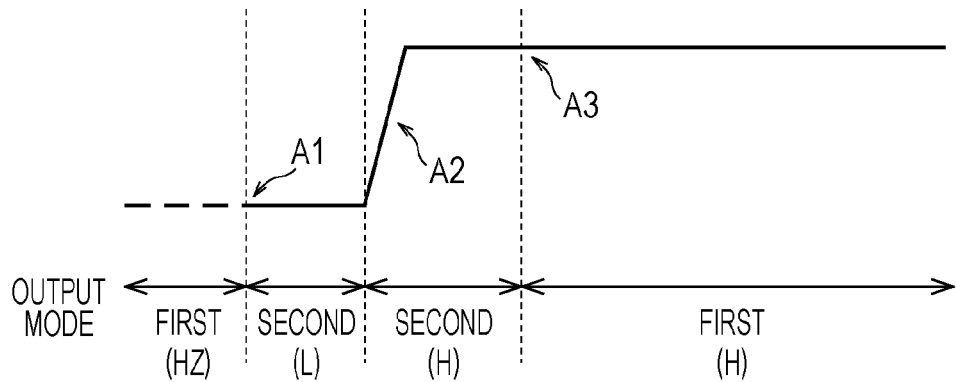
FIGS. 4A through 4C illustrate examples of an output signal waveform of a circuit apparatus.
Figure 4B:
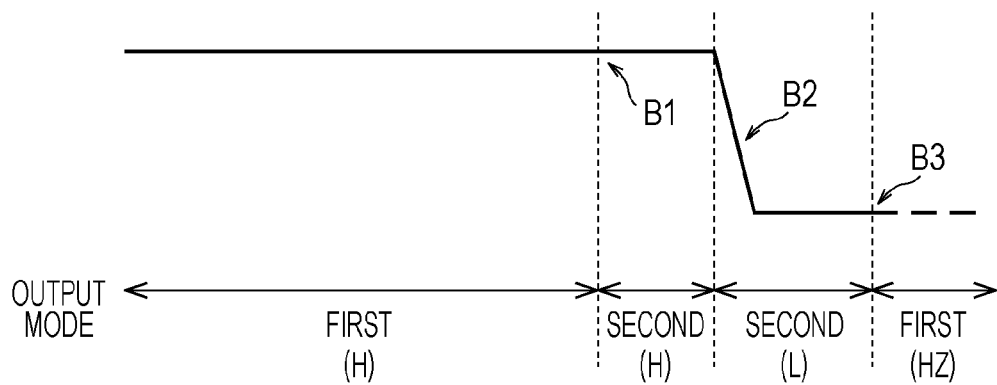
Figure 4C:
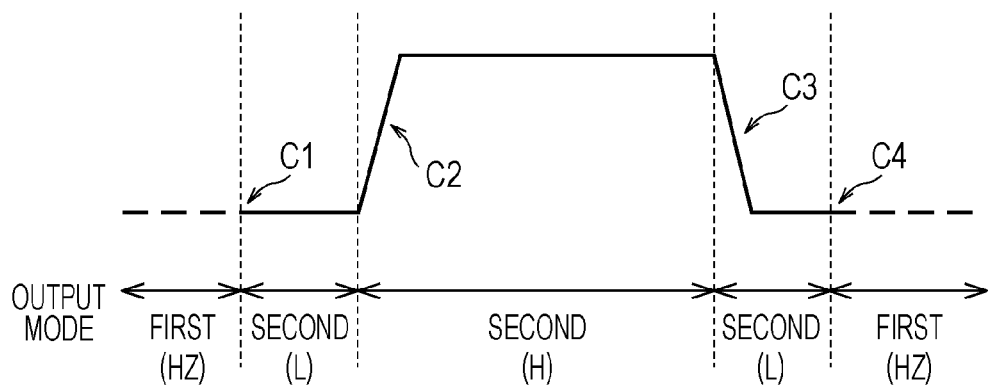

FIGS. 4A through 4C illustrate examples of the output signal waveform of the circuit apparatus 100 according to this embodiment. FIG. 4A illustrates an example of a signal waveform in the case where the output signal changes from L level (broadly defined as a first voltage level) to H level (broadly defined as a second voltage level). In the initial state, the output circuit 110 is set to the high-impedance state HZ of the first output mode, and thus the output signal level is L level. Next, the output control circuit 120 switches the output circuit 110 from the first output mode to the second output mode (A1 in FIG. 4A). After having been set to the second output mode, the output circuit 110 changes the output node NQ from L level to H level (A2 in FIG. 4A). After the output signal level has been set to H level, the output control circuit 120 switches the output circuit 110 from the second output mode to the first output mode (that is, to H level output) (A3 in FIG. 4A).

FIG. 4B illustrates an example of a signal waveform in the case where the output signal changes from H level (broadly defined as the second voltage level) to L level (broadly defined as the first voltage level). In the initial state, the output circuit 110 is set to the first output mode, and is thus outputting H level. Next, the output control circuit 120 switches the output circuit 110 from the first output mode to the second output mode (B1 in FIG. 4B). After having been set to the second output mode, the output circuit 110 changes the output node NQ from H level to L level (B2 in FIG. 4B). After the output signal level has been set to L level, the output control circuit 120 returns the output circuit 110 from the second output mode to the first output mode (HZ) (B3 in FIG. 4B).

FIG. 4C illustrates an example of a signal waveform in the case where the output signal is changed from L level to H level and is then once again changed from H level to L level. In the initial state, the output circuit 110 is set to the high-impedance state HZ of the first output mode, and thus the output signal level is L level. Next, the output control circuit 120 switches the output circuit 110 from the first output mode to the second output mode (C1 in FIG. 4C). After having been set to the second output mode, the output circuit 110 changes the output node NQ from L level to H level (C2 in FIG. 4C). After the output signal level has been set to H level, the output circuit 110 changes the output node NQ from H level to L level (C3 in FIG. 4C). After the output signal level has been set to L level, the output control circuit 120 returns the output circuit 110 from the second output mode to the first output mode (HZ) (C4 in FIG. 4C).

As described thus far, with the circuit apparatus according to this embodiment, when the output circuit 110 outputs an output signal to the output node NQ, the output control circuit 120 switches the output circuit 110 from the first output mode, in which the output node NQ is set to the high-impedance state HZ, to the second output mode. After being set to the second output mode, the output circuit 110 outputs a voltage level corresponding to the output signal to the output node NQ. Then, after that voltage level has been outputted to the output node NQ, the output control circuit 120 switches the mode from the second output mode to the first output mode.

Switching the output mode in this manner makes it possible to reduce the amount of time of the drop from H level to L level (that is, the amount of time of the drop or the amount of time of the fall). In other words, with the circuit apparatus according to this embodiment, turning the N-type transistor TN on in the second output mode causes the charge accumulated in the capacitor CA of the host apparatus 200 to be discharged in a shorter amount of time than that shown in the comparative example (FIG. 3B), which makes it possible to reduce the amount of time of the fall of the output signal. As a result, the amount of time required for, for example, the host apparatus to switch its communication partner to another circuit apparatus can be reduced, which makes it possible to shorten the communication time between the host apparatus and the circuit apparatus.

Figure 8:
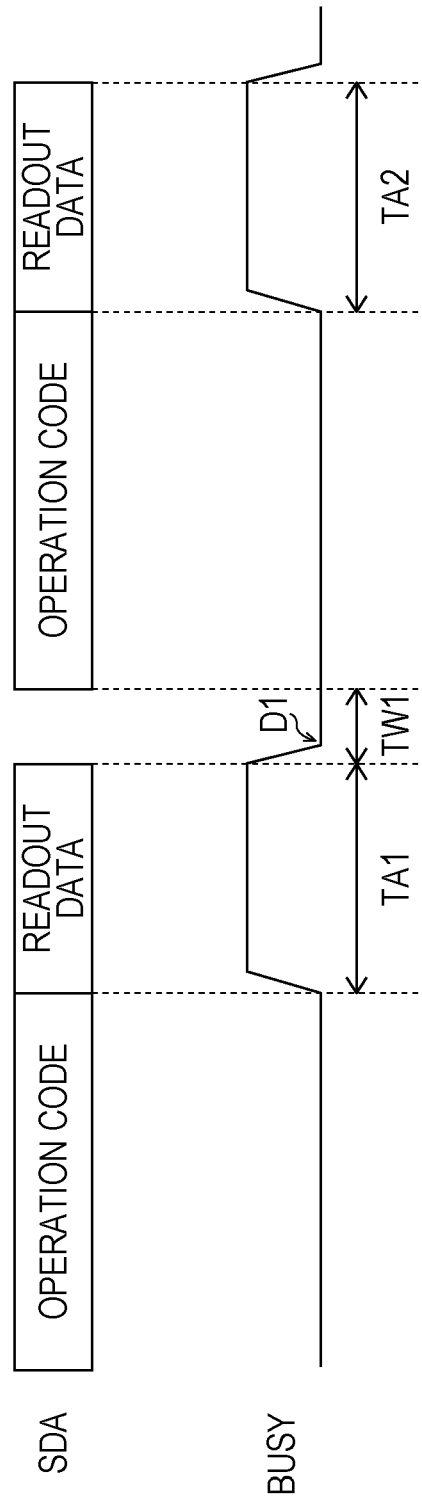
FIG. 8 is a diagram illustrating an effect of a busy signal outputted by an output circuit.

For example, as shown in FIG. 8 (discussed later), in the case where the output signal is a signal that notifies the host apparatus 200 that a command issued by the host apparatus 200 is currently being processed (that is, a busy signal BUSY), the host apparatus 200 can recognize the end of the command processing sooner. As a result, because the amount of time for which the host apparatus 200 waits to send the next command or the like (operation code) can be reduced, the communication time between the host apparatus and the circuit apparatus can be shortened.

Note that in FIG. 1, the configuration may be such that a capacitor for eliminating noise, a resistor, or the like are connected to the output node NQ of the output circuit 110.

For example, in the case of the comparative example illustrated in FIG. 3A, connecting a capacitor for eliminating noise, a resistor, or the like to the output node NQ of the output circuit 510 further dulls the waveform in the period T3 shown in FIG. 3B, which makes it further difficult to shorten the communication time between the host apparatus and the circuit apparatus.

As opposed to this, with the embodiment illustrated in FIG. 1, the drive capabilities of the N-type transistor TN of the output circuit 110 ensure that the waveform is not significantly dulled even if a capacitor for noise elimination, a resistor, or the like is connected to the output node NQ. Accordingly, both an effect in which the communication time between the host apparatus and the circuit apparatus is shortened and an effect in which noise in the signal is reduced can be realized.

2. System

Figure 5:
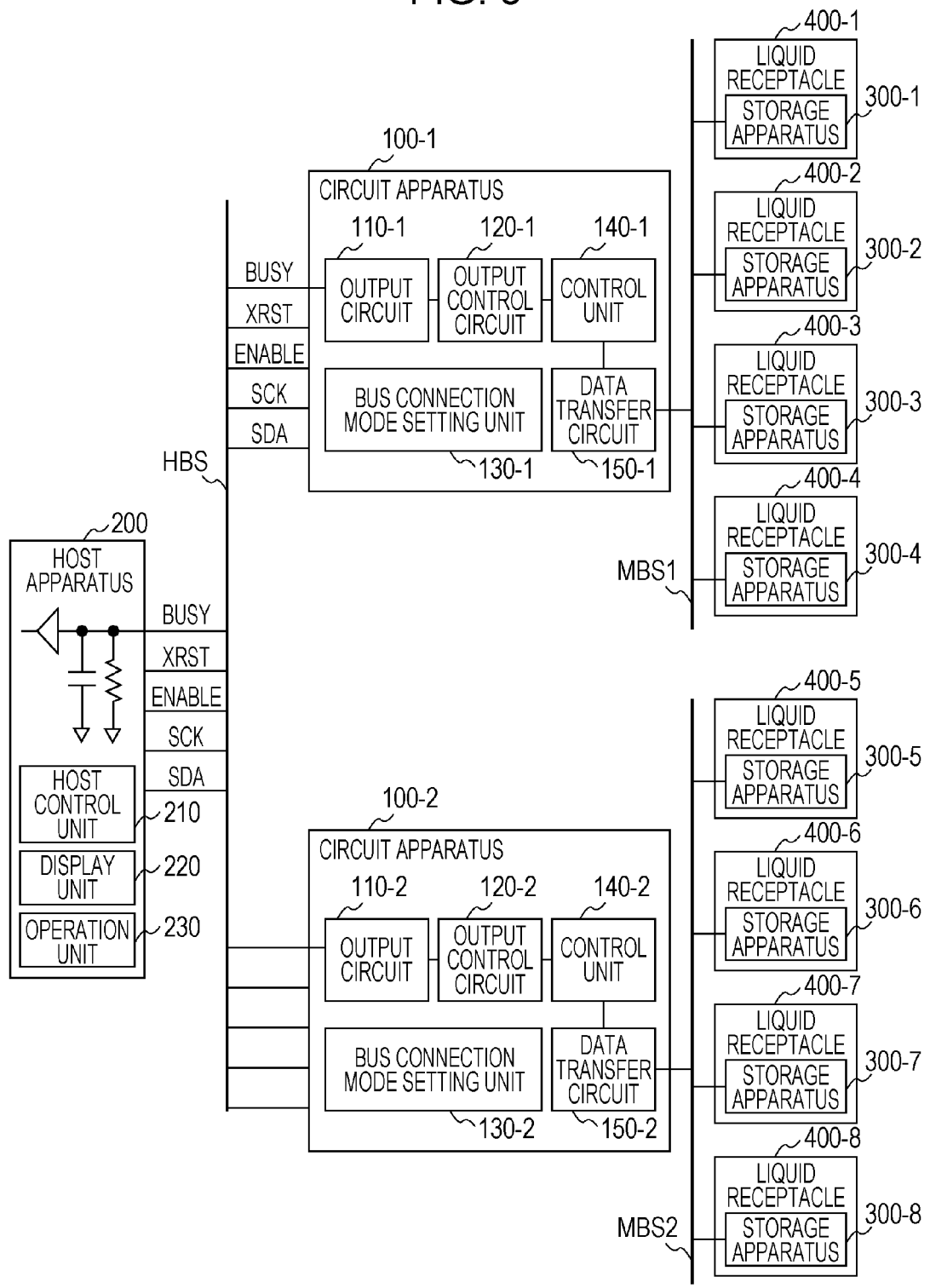
FIG. 5 illustrates a first configuration example of a system.

FIG. 5 illustrates a first example of the configuration of a system that includes the circuit apparatus 100 and the host apparatus 200 according to this embodiment. The system in FIG. 5 is, for example, a printer, and includes two circuit apparatuses 100-1 and 100-2 and the host apparatus 200. Furthermore, the system (printer) includes first through eighth storage apparatuses 300-1 through 300-8 and eight liquid receptacles (ink cartridges) 400-1 through 400-8. It should be noted that the system according to this embodiment is not limited to the configuration illustrated in FIG. 5; many variations thereupon are possible, such as omitting some of the constituent elements, replacing those constituent elements with other constituent elements, adding other constituent elements, and so on.

The circuit apparatus 100 according to this embodiment includes, as mentioned earlier, the output circuit 110, the output control circuit 120, the bus connection mode setting unit 130, and the control unit 140. The circuit apparatus 100 further includes a data transfer circuit 150, and this data transfer circuit 150 transfers data between the multiple storage apparatuses 300-1 through 300-8, which are connected to memory connection buses MBS1 and MBS2, respectively, and the host apparatus 200.

To be more specific, a data transfer circuit 150-1 of the first circuit apparatus 100-1 transfers data between the four storage apparatuses 300-1 through 300-4 connected to the memory connection bus MBS1 and the host apparatus 200, whereas a data transfer circuit 150-2 of the second circuit apparatus 100-2 transfers data between the other four storage apparatuses 300-5 through 300-8 connected to the memory connection bus MBS2 and the host apparatus 200. In this manner, the data transfer can be carried out in an efficient manner by carrying out the data transfer having divided the eight storage apparatuses into two groups containing four storage apparatuses each.

The circuit apparatuses 100-1 and 100-2 exchange signals with the host apparatus 200 via the bus HBS. Specifically, the bus HBS includes, as shown in FIG. 5, signal lines for the busy signal BUSY, a reset signal XRST, an enable signal ENABLE, a clock signal SCK, and a data signal SDA. The output signal of this output circuit 110 according to this embodiment is the busy signal BUSY, and the busy signal BUSY is a signal for notifying the host apparatus 200 that a command issued by the host apparatus 200 is currently being processed. Meanwhile, the data signal SDA is a signal indicating write and readout data of the storage apparatuses 300-1 through 300-8.

The storage apparatuses 300-1 through 300-8 are provided in respective corresponding eight liquid receptacles (ink cartridges) 400-1 through 400-8. Each storage apparatus includes a memory (for example, a non-volatile memory), and each memory stores ID (identification) information for identifying the eight liquid receptacles (ink cartridges) 400-1 through 400-8, manufacturing information, information written from the host apparatus 200, and so on. Information indicating the date of manufacture, information indicating the ink color, or the like can be given as examples of the manufacturing information, whereas information indicating the remaining amount of ink can be given as an example of the information written from the host apparatus 200. The memories can be configured of, for example, a non-volatile memory such as an FERAM (ferroelectric memory), a flash memory, or the like.

The host apparatus 200 is, for example, the main unit of the printer, and includes a host control unit 210, a display unit 220, and an operation unit 230. The host control unit 210 performs control of communication processes with the storage apparatuses described above, control necessary in the printing processes performed by the printer, calculation of the remaining amount of ink in the ink cartridges (liquid receptacles), and control of communication processes with external devices. The display unit 220 is, for example, an LCD (liquid crystal display), and displays operation screens, operational statuses, error messages, and so on of the printer. The operation unit 230 is configured of, for example, a keypad, and is used by a user in order to operate the printer.

With the first example of the configuration of the system illustrated in FIG. 5, the first bus connection mode is set by the bus connection mode setting unit 130. The first bus connection mode is, as shown in FIG. 5, a mode in which the host apparatus 200 and the multiple circuit apparatuses 100-1 and 100-2 are connected to the bus HBS. In this first bus connection mode, the output control circuits 120-1 and 120-2 switch the output circuits 110-1 and 110-2 from the first output mode to the second output mode, and return the output circuits 110-1 and 110-2 from the second output mode to the first output mode after the output signal (for example, in FIG. 5, the busy signal BUSY) has been outputted. In other words, as shown in FIG. 4C, the output mode is switched and the output signal (the busy signal BUSY) is outputted.

Figure 6:
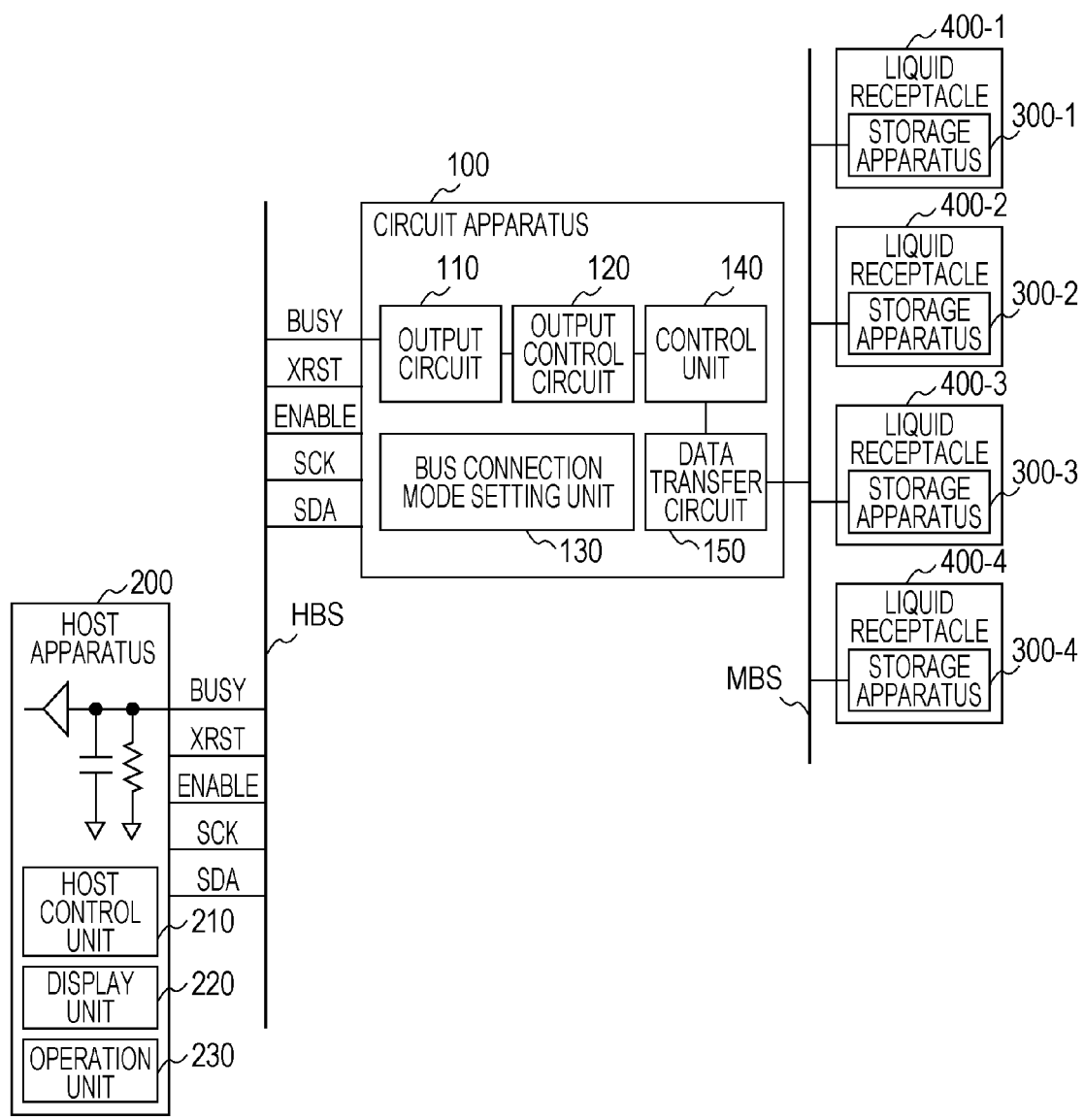
FIG. 6 illustrates a second configuration example of a system.

FIG. 6 illustrates a second example of the configuration of a system that includes the circuit apparatus 100 and the host apparatus 200 according to this embodiment. The system according to the second configuration example illustrated in FIG. 6 is, for example, a printer, as with the aforementioned first configuration example, but in this example, the host apparatus 200 and a single circuit apparatus 100 are connected to the bus HBS. The storage apparatuses 300-1 through 300-4 are connected to the circuit apparatus 100 via a memory connection bus MBS.

With the second example of the configuration of the system, the second bus connection mode is set by the bus connection mode setting unit 130. As shown in FIG. 6, with the second bus connection mode, the host apparatus 200 and a single circuit apparatus 100 are connected to the bus HBS, whereas the other circuit apparatus is not connected. In this second bus connection mode, the other circuit apparatus is not connected, and thus it is not necessary to set the output node NQ to the high-impedance state HZ in order to prevent interference with the other circuit apparatus. In other words, it is not necessary to set the first output mode. Accordingly, the output control circuit 120 can set the output circuit 110 to the second output mode so as to output the output signal (busy signal BUSY).

For example, in the case of the first example of the configuration of the system shown in FIG. 5, the bus connection mode setting units 130-1 and 130-2 instruct the control units 140-1 and 140-2 to perform control for switching the mode when the output circuits 110-1 and 110-2 output the output signal and after the output signal has been outputted.

On the other hand, in the case of the second example of the configuration of the system shown in FIG. 6, the bus connection mode setting unit 130 instructs the control unit 140 to make the output mode static.

The control units 140-1, 140-2, and 140 set register values based on the instructions, and thus set the output modes of the output control circuits 120-1, 120-2, and 120.

In this manner, with the circuit apparatus according to this embodiment, either the first or the second bus connection mode can be set in accordance with the number of storage apparatuses (liquid receptacles, ink cartridges). In other words, in the case where there is a large number of storage apparatuses, setting the first bus connection mode and providing multiple circuit apparatuses makes it possible to carry out data communication between many storage apparatuses and a host apparatus in an efficient manner. On the other hand, in the case where there is a small number of storage apparatuses, data communication can be carried out between the multiple storage apparatuses and the host apparatus by setting the second bus connection mode and using a single circuit apparatus.

With ink jet printers and the like, for example, four colors of ink are used, or more colors of ink (for example, five or more) are used. In other words, there is an n (where n is an integer of 2 or more) color mode in which n colors of ink are used, and a k (where k is an integer in which $1 \leq k < n$) color mode in which fewer colors of ink than in the n color mode are used.

In the case of the n color mode, setting the circuit apparatuses to the first bus connection mode makes it possible to provide n storage apparatuses using the multiple circuit apparatuses, or in other words, makes it possible to provide n liquid receptacles (ink cartridges). On the other hand, in the case of the k color mode, setting the circuit apparatus to the second bus connection mode makes it possible to provide k storage apparatuses, where k is less than n, using a single circuit apparatus, or in other words, makes it possible to provide k liquid receptacles (ink cartridges).

In this manner, with the circuit apparatus according to this embodiment, in the case where the number of colors of ink that are used is to be increased in a printer (system) or the like, it is possible to increase the number of ink cartridges by increasing the number of circuit apparatuses. As a result, the number of colors of ink can be increased without changing the design of the bus, the data transfer circuit, or the like, which makes it possible to reduce the design cost, the manufacturing cost, and so on.

Figure 7:
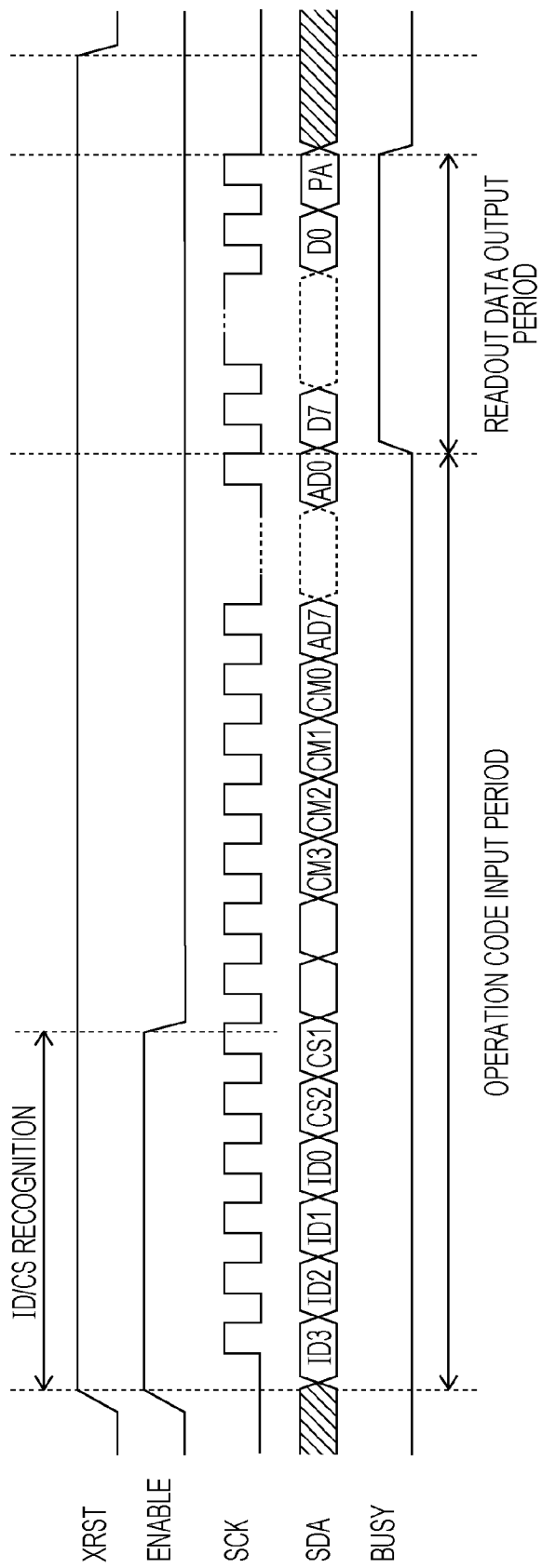
FIG. 7 illustrates an example of a timing chart for various signals in a system.

FIG. 7 is an example of a timing chart of the respective signals exchanged via the bus HBS in the system (for example, a printer) shown in FIG. 5 and FIG. 6. FIG. 7 illustrates the timings of the reset signal XRST, the enable signal ENABLE, the clock signal SCK, the data signal SDA, and the busy signal BUSY.

The reset signal XRST is outputted from the host apparatus 200, and during the period when the signal level is H level, the resetting of the circuit apparatus 100 is canceled. The enable signal ENABLE is outputted from the host apparatus 200, and the period when the signal level is H level is an ID/CS recognition period. In other words, in this period, ID information and chip select (CS) information are sent from the host apparatus 200 to the circuit apparatus 100 as the data signal SDA. The clock signal SCK is a signal for supplying a clock from the host apparatus 200 to the circuit apparatus 100.

The data signal SDA is a signal for sending an operation code from the host apparatus 200 to the circuit apparatus 100, and for sending, from the circuit apparatus 100 to the host apparatus 200, data that has been read out from the storage apparatus 300. For example, in FIG. 7, the operation code is configured of ID information ID0 through ID3, CS information CS1 and CS2, command information CM0 through CM3, and address information AD0 through AD7. The readout data is configured of D0 through D7 and parity PA.

The busy signal BUSY is a signal for notifying the host apparatus 200 that a command issued by the host apparatus 200 is currently being processed by the circuit apparatus 100. For example, in FIG. 7, the busy signal BUSY notifies the host apparatus 200 that the circuit apparatus 100 is currently outputting the data D0 through D7 and the parity PA read out from the storage apparatus 300 to the host apparatus 200. In other words, setting the busy signal BUSY to H level during the readout data output period notifies the host apparatus 200 that the readout data is currently being outputted.

As described above, in the first bus connection mode (for example, FIG. 5), the two output modes are switched and the busy signal BUSY is outputted, as shown in, for example, FIG. 4C. Doing so makes it possible to prevent interference with another circuit apparatus, and furthermore makes it possible to reduce the amount of time required for the busy signal BUSY to fall from H level to L level. On the other hand, in the second bus connection mode (for example, FIG. 6), the other circuit apparatus is not connected, and thus the busy signal BUSY can be outputted in the second output mode; accordingly, it is possible to reduce the amount of time required for the busy signal BUSY to fall from H level to L level.

FIG. 8 is a diagram illustrating an effect of the busy signal BUSY outputted by the output circuit 110 in this embodiment. FIG. 8 illustrates the busy signal BUSY when the host apparatus 200 reads out data from the first and second circuit apparatuses 100-1 and 100-2.

The first circuit apparatus 100-1 outputs the readout data during a first readout data output period TA1. As described above, the busy signal BUSY is set to H level during the period TA1, and as a result the host apparatus 200 recognizes that the readout data is currently being outputted. When the output of the readout data has finished, the first circuit apparatus 100-1 returns the busy signal BUSY to L level. The host apparatus 200 detects that the busy signal BUSY has fallen to L level, and thus recognizes that the output of data has ended (D1 in FIG. 8). Then, after a predetermined amount of time has passed, the next operation code is sent in order for data to be read out from the second circuit apparatus 100-2.

A waiting time TW1 from when the output of the readout data ends to when the sending of the next operation code begins is shorter the quicker the busy signal BUSY goes to L level (D1 in FIG. 8). Accordingly, with the circuit apparatus 100 according to this embodiment, the amount of time required for the busy signal BUSY to fall from H level to L level can be reduced, which makes it possible to shorten the waiting time TW1 until the next operation code is sent.

Reducing the amount of time required for the busy signal BUSY to return to L level from H level makes it possible to reduce the amount of time required for the host apparatus to switch its communication partner to another circuit apparatus, reduce the amount of time required for the host apparatus to move to another process, and so on, which in turn enables efficient communication.

3. Liquid Receptacle

Figure 9:
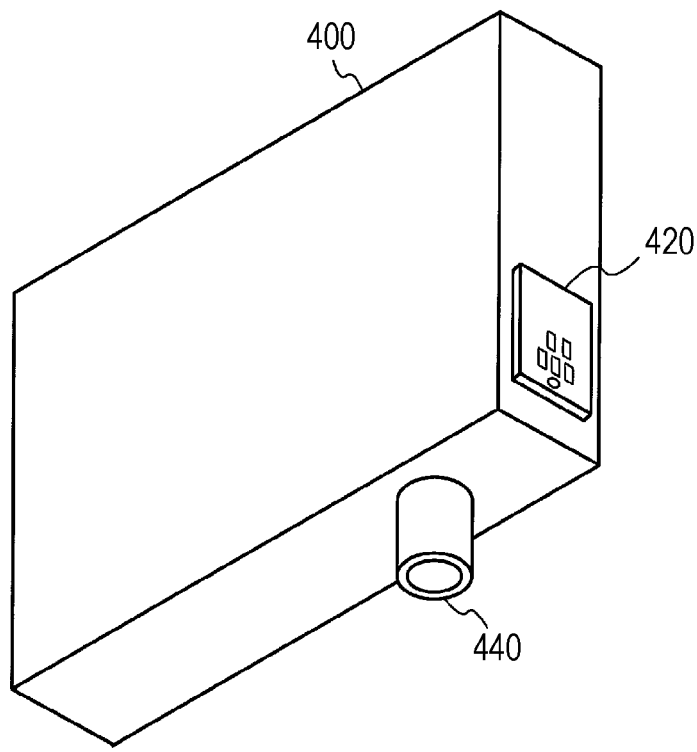
FIG. 9 is an example illustrating the configuration of a liquid receptacle in detail.

FIG. 9 illustrates an example of the configuration of the liquid receptacle 400, in which the storage apparatus 300 is provided, in detail. Note that the following describes an example of a case in which the host apparatus 200 is the main unit of an ink jet printer, the liquid receptacle 400 is an ink cartridge, and the substrate 420 is a circuit substrate provided in the ink cartridge. However, it should be noted that in this embodiment, the host apparatus, the circuit apparatus, the liquid receptacle, and the substrate may be other apparatuses, receptacles, or substrates. For example, the host apparatus may be a memory card reader/writer, and the substrate may be a circuit substrate provided in a memory card.

An ink chamber (not shown) for holding ink is formed within the ink cartridge 400 (broadly defined as a liquid receptacle) illustrated in FIG. 9. Furthermore, an ink supply opening 440 that communicates with the ink chamber is provided in the ink cartridge 400. This ink supply opening 440 supplies ink to a print head unit when the ink cartridge 400 is mounted in the printer.

The ink cartridge 400 includes a circuit substrate 420 (broadly defined as a substrate). The storage apparatus 300 is provided in the circuit substrate 420, and the storage apparatus 300 stores data, exchanges data with the host apparatus 200 via the circuit apparatus 100, and so on. The circuit substrate 420 is implemented as, for example, a printed circuit board, and is provided on the surface of the ink cartridge 400. Terminals such as a high potential power source terminal VDD or the like are provided in the circuit substrate 420. When the ink cartridge 400 is mounted in the printer, these terminals make contact with (that is, are electrically connected to) terminals in the printer, which makes it possible to exchange power, data, and so on.

Figure 10A:
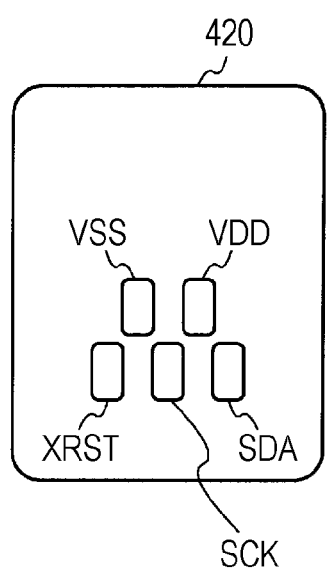
FIGS. 10A and 10B are examples illustrating the configuration of a circuit substrate in detail.
Figure 10B:
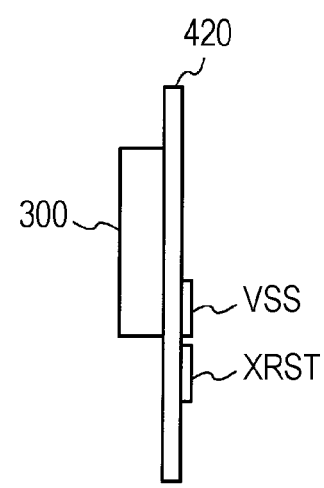

FIGS. 10A and 10B illustrate an example of the configuration of the circuit substrate 420, in which the storage apparatus 300 is provided, in detail. As shown in FIG. 10A, a terminal group including multiple terminals is provided on the surface of the circuit substrate 420 (the surface that connects to the printer). This terminal group includes a low potential power source terminal VSS, the high potential power source terminal VDD, a reset terminal XRST, a clock terminal SCK, and a data terminal SDA. Each terminal is implemented as a metal terminal formed in, for example, a rectangular shape (an approximately rectangular shape). Each terminal is connected to the storage apparatus 300 via a wiring pattern layer, a through hole, or the like (not shown) provided in the circuit substrate 420.

As shown in FIG. 10B, the storage apparatus 300 is provided on the rear surface of the circuit substrate 420 (that is, the rear side of the surface that is connected to the printer). The storage apparatus 300 can be realized as, for example, a semiconductor storage apparatus that includes a ferroelectric memory. Various types of data relating to the ink or the ink cartridge 400 is stored within the storage apparatus 300, and for example, ID information for identifying the ink cartridge 400, data indicating the amount of ink that is consumed, and so on are stored in the storage apparatus 300. The data indicating the amount of ink that is consumed is data indicating the cumulative total of the amount of ink, held within the ink cartridge 400, that is consumed when printing is executed. The data indicating the amount of ink that is consumed may be information indicating the amount of ink within the ink cartridge 400, or may be information indicating the ratio of the amount of consumed ink.

Although an embodiment has been described in detail thus far, it should be noted that many variations that do not depart from the novel content and effects of the invention will be apparent to one skilled in the art. Such variations should therefore be taken as being included within the scope of the invention. For example, in the specification or drawings, terms that have broader or the same definitions as terms that have been used once and that are denoted along with the stated terms can be replaced with those terms in all areas of the specification or drawings. Furthermore, the configurations and operations of the circuit apparatus and the system are not intended to be limited to the embodiment, and many variations thereon are possible as well.

The entire disclosure of Japanese Patent Application No. 2010-147673, filed Jun. 29, 2010 is expressly incorporated by reference herein.

What is claimed is:

1. A circuit apparatus comprising:
an output circuit that outputs a signal to a host apparatus via a bus;
an output control circuit that controls the output circuit, and
a data transfer circuit that transfers data between multiple storage apparatuses connected to a memory connection bus and the host apparatus, wherein the storage apparatus is a storage apparatus provided in a liquid receptacle;
wherein the output circuit includes:
a first conductive transistor provided between an output node and a first power source node; and
a second conductive transistor provided between the output node and a second power source node, the output control circuit:
sets one of the first conductive transistor and the second conductive transistor to off and controls the other transistor on or off in a first output mode; and
sets the first conductive transistor to on and the second conductive transistor to off, or sets the first conductive transistor to off and the second conductive transistor to on, in a second output mode, and
when the output circuit outputs an output signal to the output node:
the output control circuit switches from the first output mode, in which the output node is set to a high-impedance state, to the second output mode;

the output circuit outputs a voltage level corresponding to the output signal to the output node after the second output mode has been set; and the output control circuit switches the output circuit from the second output mode to the first output mode after the voltage level has been outputted to the output node.

2. The circuit apparatus according to claim 1,
wherein in the case where the output signal is changed from a first voltage level to a second voltage level,
the output control circuit switches the output circuit from the first output mode to the second output mode,
the output circuit changes the output node from the first voltage level to the second voltage level after being set to the second output mode, and
in the case where the output signal is changed from the second voltage level to the first voltage level,
the output control circuit switches the output circuit from the first output mode to the second output mode,
the output circuit changes the output node from the second voltage level to the first voltage level after being set to the second output mode, and
the output control circuit switches the output circuit from the second output mode to the first output mode after the output node has been set to the first voltage level.

3. A system comprising the circuit apparatus according to claim 2 and the host apparatus.

4. The circuit apparatus according to claim 1,
wherein in a first bus connection mode, the host apparatus and another circuit apparatus are connected to the bus;
in a second bus connection mode, the host apparatus is connected to the bus, and the other circuit apparatus is not connected to the bus;
in the second bus connection mode, the output control circuit sets the output circuit to the second output mode; and
in the first bus connection mode, the output control circuit switches the output circuit from the first output mode to the second output mode, and returns the output circuit from the second output mode to the first output mode after the output signal has been outputted.

5. The circuit apparatus according to claim 4, further comprising:
a bus connection mode setting unit that sets the first bus connection mode and the second bus connection mode.

6. A system comprising the circuit apparatus according to claim 5 and the host apparatus.

7. A system comprising the circuit apparatus according to claim 4 and the host apparatus.

8. The circuit apparatus according to claim 1,
wherein the output signal outputted by the output circuit is a busy signal that notifies the host apparatus that a command issued by the host apparatus is currently being processed.

9. A system comprising the circuit apparatus according to claim 8 and the host apparatus.

10. The circuit apparatus according to claim 1,
wherein in the case of an n (where n is an integer of 2 or more) color mode, the first bus connection mode is set; and
in the case of a k (where k is an integer in which $1 \leq k < n$) color mode, the second bus connection mode is set.

11. A system comprising the circuit apparatus according to claim 10 and the host apparatus.

12. A system comprising the circuit apparatus according to claim 1 and the host apparatus.

13. A system comprising the circuit apparatus according to claim 1 and the host apparatus.

14. A system comprising the circuit apparatus according to claim 1 and the host apparatus.

15. A circuit apparatus comprising:
an output circuit that outputs a signal to a host apparatus via a bus;
an output control circuit that controls the output circuit,
a control unit carrying out output mode setting process; and
wherein the output signal outputted by the output circuit is a busy signal that notifies the host apparatus that a command issued by the host apparatus is currently being processed,
wherein the control unit includes a register, setting an output mode of the output control circuit based on the value of the register, wherein the output mode comprises of a first and a second output modes, and
wherein the output circuit includes:
a first conductive transistor provided between an output node and a first power source node; and
a second conductive transistor provided between the output node and a second power source node,
the output control circuit:
sets one of the first conductive transistor and the second conductive transistor to off and controls the other transistor on or off in the first output mode; and
sets the first conductive transistor to on and the second conductive transistor to off, or sets the first conductive transistor to off and the second conductive transistor to on, in the second output mode, and
when the output circuit outputs the output signal to the output node:
the control unit switches from the first output mode, in which the output node is set to a high-impedance state, to the second output mode;
the output circuit outputs a voltage level corresponding to the busy signal to the output node after the second output mode has been set; and
the control unit switches the output circuit from the second output mode to the first output mode after the voltage level has been outputted to the output node.

* * * * *